(12) United States Patent
Moon et al.

(10) Patent No.: US 10,056,572 B2
(45) Date of Patent: Aug. 21, 2018

(54) ORGANIC LIGHT-EMITTING ELEMENT

(71) Applicant: LG DISPLAY CO., LTD., Seoul (KR)

(72) Inventors: Young Kyun Moon, Daejeon (KR); Jin Bok Lee, Daejeon (KR); Byung Woo Yoo, Daejeon (KR); Minsoo Kang, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/310,676

(22) PCT Filed: Apr. 30, 2015

(86) PCT No.: PCT/KR2015/004408
§ 371 (c)(1),
(2) Date: Nov. 11, 2016

(87) PCT Pub. No.: WO2015/174669
PCT Pub. Date: Nov. 19, 2015

(65) Prior Publication Data
US 2017/0125723 A1    May 4, 2017

(30) Foreign Application Priority Data
May 12, 2014    (KR) .................. 10-2014-0056768

(51) Int. Cl.
*H01L 51/52* (2006.01)
*H01L 51/56* (2006.01)
*H01L 27/32* (2006.01)

(52) U.S. Cl.
CPC ...... *H01L 51/5212* (2013.01); *H01L 51/5209* (2013.01); *H01L 51/5228* (2013.01); *H01L 51/56* (2013.01); *H01L 27/32* (2013.01); *H01L 2251/5361* (2013.01); *H01L 2251/5392* (2013.01)

(58) Field of Classification Search
CPC ............. H01L 27/3202; H01L 27/3276; H01L 27/3288; H01L 27/3297; H01L 51/5209; H01L 51/5212; H01L 51/5225; H01L 51/5228
See application file for complete search history.

(56) References Cited

U.S. PATENT DOCUMENTS

| | | | |
|---|---|---|---|
| 6,157,127 A * | 12/2000 | Hosokawa | H01L 27/3288 313/506 |
| 6,525,467 B1 * | 2/2003 | Eida | H01L 27/3281 313/504 |
| 6,538,391 B1 | 3/2003 | Suzuki et al. | |
| 6,713,955 B1 | 3/2004 | Roitman et al. | |
| 2003/0006697 A1 * | 1/2003 | Weaver | H01L 27/3246 313/503 |

(Continued)

FOREIGN PATENT DOCUMENTS

| | | |
|---|---|---|
| CN | 1976054 A | 6/2007 |
| CN | 102354730 A | 2/2012 |

(Continued)

OTHER PUBLICATIONS

Machine translation of JP 2001196191 A.*

*Primary Examiner* — Bryan Junge
(74) *Attorney, Agent, or Firm* — Dentons US LLP

(57) ABSTRACT

The present specification relates to an organic light emitting device.

19 Claims, 4 Drawing Sheets

(56) References Cited

U.S. PATENT DOCUMENTS

| | | | |
|---|---|---|---|
| 2005/0230678 A1* | 10/2005 | Cao | ............... H01L 51/5203 257/40 |
| 2007/0236142 A1 | 10/2007 | You | |
| 2012/0161616 A1 | 6/2012 | Yamagishi et al. | |
| 2012/0205679 A1* | 8/2012 | Hiroki | ............ H01L 27/3202 257/88 |
| 2014/0103304 A1 | 4/2014 | Kang et al. | |
| 2015/0194624 A1 | 7/2015 | Jeong et al. | |

FOREIGN PATENT DOCUMENTS

| | | |
|---|---|---|
| CN | 104471735 A | 3/2015 |
| JP | 2000-164357 A | 6/2000 |
| JP | 2000-277267 A | 10/2000 |
| JP | 2001-076649 A | 3/2001 |
| JP | 2001-196191 A | 7/2001 |
| JP | 2007-250329 A | 9/2007 |
| JP | 2007-280920 A | 10/2007 |
| JP | 2010-080453 A | 4/2010 |
| KR | 10-2012-0055534 A | 5/2012 |
| KR | 10-2014-0011966 A | 1/2014 |
| KR | 10-2014-0049401 A | 4/2014 |

\* cited by examiner

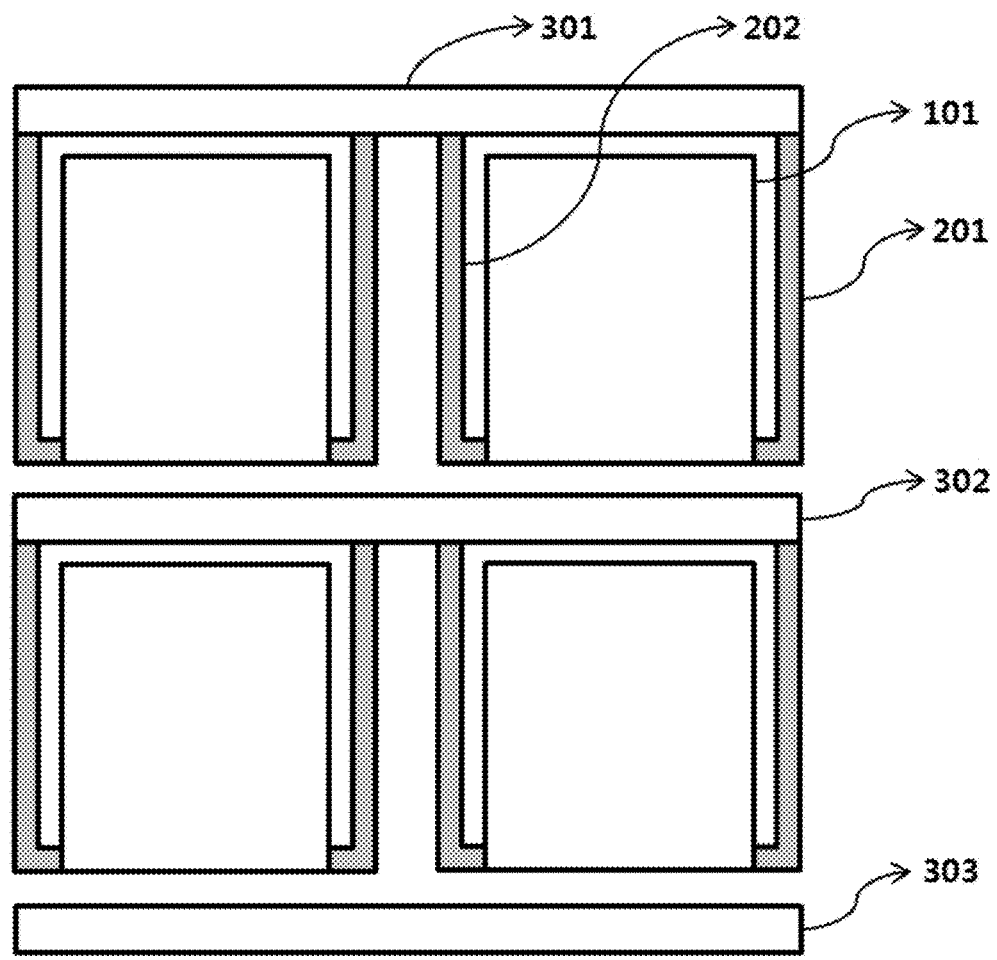
[Fig. 1]

[Fig. 2]
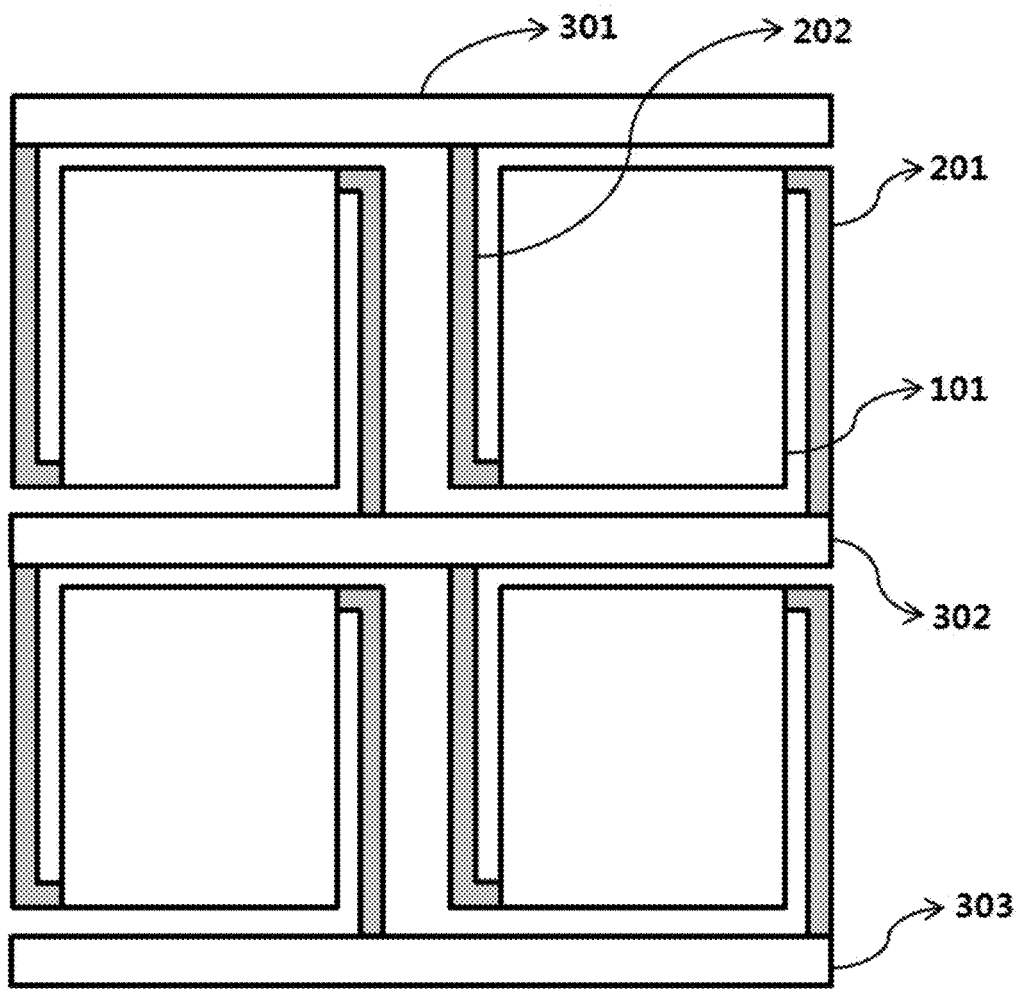

[Fig. 3]
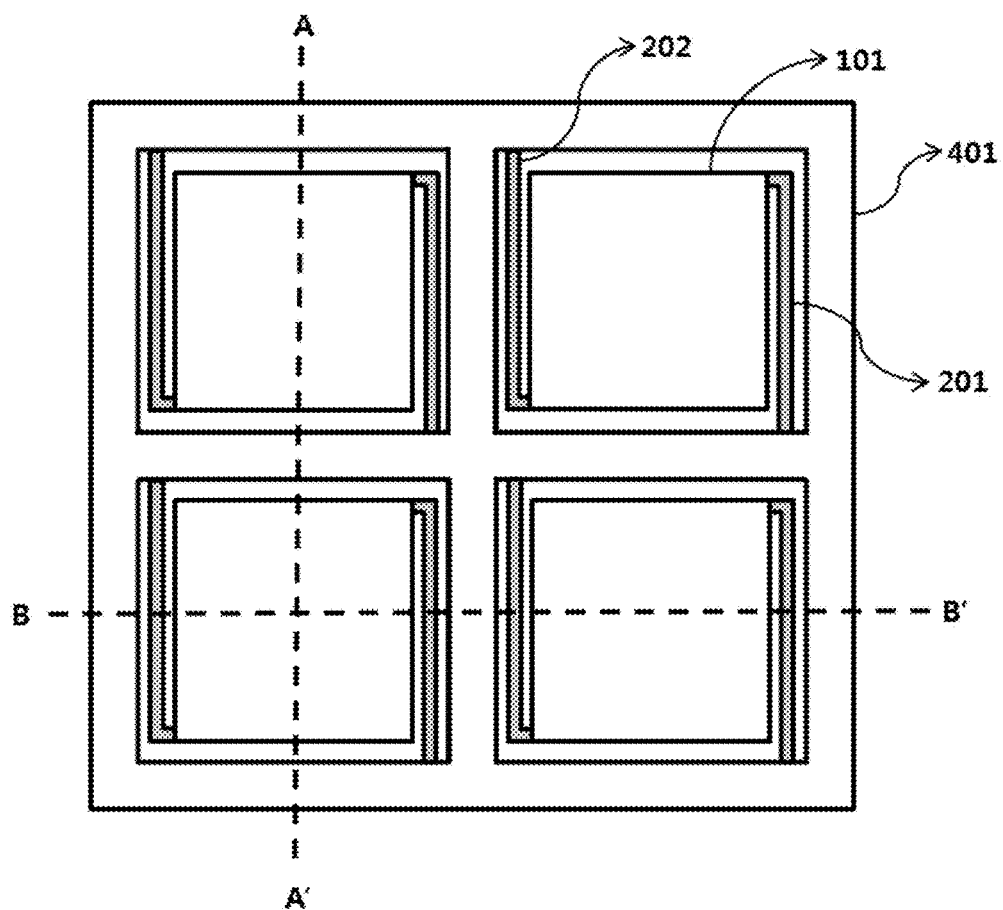

[Fig. 4]
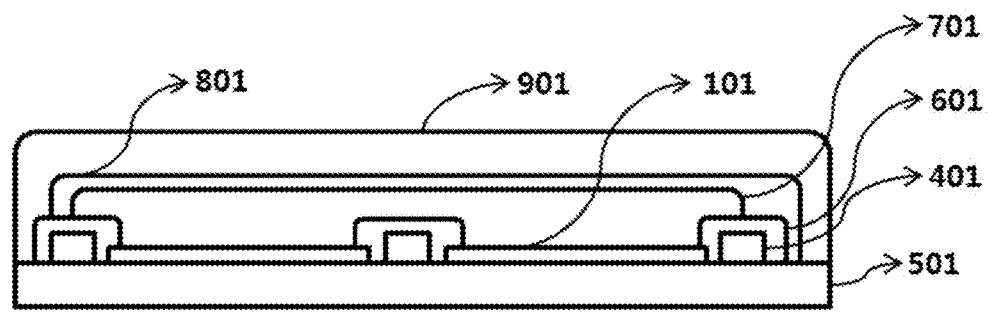
[Fig. 5]
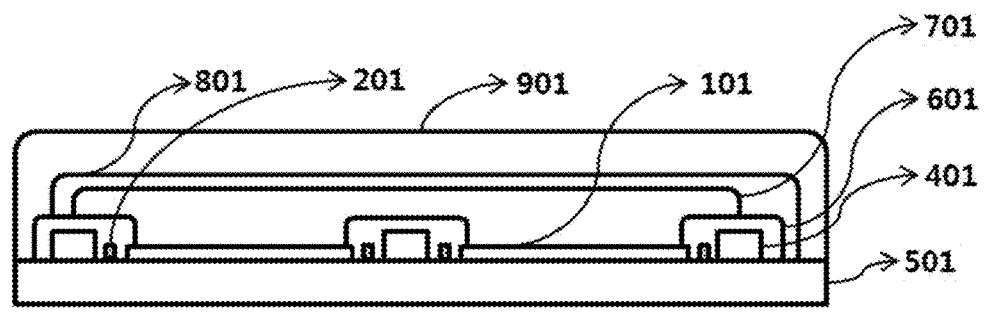
[Fig. 6]
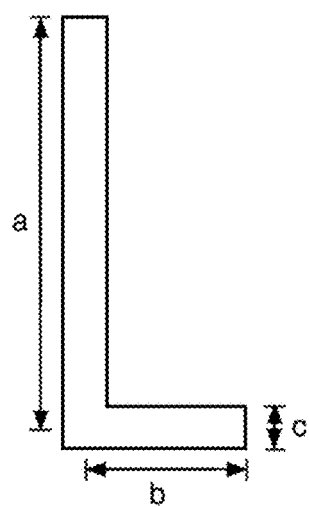

ORGANIC LIGHT-EMITTING ELEMENT

TECHNICAL FIELD

This application is a National Stage Entry of International Application No. PCT/KR2015/004408, filed Apr. 30, 2015, and claims the benefit of and priority to Korean Application No. 10-2014-0056768, filed on May 12, 2014, each of which is hereby incorporated by reference in its entirety for all purposes as if fully set forth herein.

The present specification relates to an organic light emitting device and a method for manufacturing the same.

BACKGROUND ART

An organic light emission phenomenon refers to a phenomenon converting electrical energy to light energy using an organic material. In other words, when a proper organic material layer is placed between an anode and a cathode and a voltage is applied between the two electrodes, holes and electrons are injected to the organic material layer from the anode and the cathode, respectively. These injected holes and electrons meet to form excitons, and light emits when these excitons fall back to the ground state.

An organic light emitting device is likely to have short defects since space between an anode and a cathode is small. By pin holes, cracks, steps in the structure of an organic light emitting device, coating roughness and the like, an anode and a cathode may be in direct contact with each other, or an organic layer thickness may be made to be thinner in these defect regions. These defect regions provide a low-resistance path that allows a current flow, and make the flow hardly flowing or not flowing at all in extreme cases through an organic light emitting device. As a result, the organic light emitting device has reduced or no light emission output. In multi-pixel display devices, short defects may decline display qualities by producing dead pixels that do not emit light or emit light having intensity less than average light intensity. In illumination or other low-resolution applications, a considerable portion of the corresponding region may not operate due to short defects. With concerns for short defects, manufacture of an organic light emitting device is typically carried out in a clean room. However, no matter how clean the environment is, it cannot be effective in removing short defects. In many cases, the thickness of an organic layer increases more than actually needed to operate a device in order to decrease the number of short defects by increasing a distance between two electrodes. Such a method adds costs in manufacturing an organic light emitting device, and short defects may not even be completely removed using such a method.

PRIOR ART DOCUMENTS

Patent Documents

Korean Patent Application Laid-Open Publication No. 10-2006-0130729 (published on 2006 Dec. 19)

DISCLOSURE

Technical Problem

An object of the present invention is to provide an organic light emitting device capable of operating in a normal range even when factors that may generate short defects are present, that is, when short defects occur.

Technical Solution

One embodiment of the present specification provides an organic light emitting device including a first electrode including two or more conductive units and two or more conductive connections connected to each of the conductive units; a second electrode provided opposite to the first electrode; one or more organic material layers provided between the first electrode and the second electrode; and a current carrying unit of the first electrode or an auxiliary electrode electrically connecting the conductive connections, wherein one end portion of the conductive connection is electrically connected to the conductive unit, and the other end portion of the conductive connection is electrically connected to the current carrying unit of the first electrode or the auxiliary electrode, and the conductive connection includes a region in which a length of a current flowing direction is longer than a width of a direction vertical thereto.

One embodiment of the present specification provides a display device including the organic light emitting device.

One embodiment of the present specification provides an illumination device including the organic light emitting device.

Advantageous Effects

An organic light emitting device according to one embodiment of the present specification is capable of normally maintaining a function of the organic light emitting device even when a short circuit occurs due to defects of a substrate itself.

In addition, an organic light emitting device according to one embodiment of the present specification can stably operate without increasing a leakage current quantity even when an area size of a short circuit occurring location increases.

Furthermore, in an organic light emitting device according to one embodiment of the present specification, any one conductive unit has two or more conductive connections, therefore, there is an advantage in that, even when disconnection occurs in any one conductive connection during a manufacturing process, the conductive unit can normally operate by the remaining conductive connections.

DESCRIPTION OF DRAWINGS

FIG. 1 illustrates one example of a first electrode and a current carrying unit of the first electrode in an organic light emitting device according to one embodiment of the present specification.

FIG. 2 illustrates one example of a first electrode and a current carrying unit of a first electrode in an organic light emitting device according to one embodiment of the present specification.

FIG. 3 illustrates one example of a first electrode and an auxiliary electrode in an organic light emitting device according to one embodiment of the present specification.

FIG. 4 illustrates one example of a section of an organic light emitting device according to one embodiment of the present specification including the A-A' section of FIG. 3.

FIG. 5 illustrates one example of a section of an organic light emitting device according to one embodiment of the present specification including the B-B' section of FIG. 3.

FIG. 6 illustrates one example of a length and a width in a conductive connection of the present specification.

EXPLANATION OF SYMBOLS

101: Conductive Unit
201, 202: Conductive Connection
301, 302, 303: Current carrying unit of First Electrode
401: Auxiliary Electrode
501: Substrate
601: Insulation Layer
701: Organic Material Layer
801: Second Electrode
901: Encapsulation Layer

MODE FOR DISCLOSURE

Hereinafter, the present specification will be described in more detail.

In the present specification, a description of one member being placed "on" another member includes not only a case of the one member adjoining the another member but a case of still another member being present between the two members.

In the present specification, a description of a certain part "including" certain constituents means capable of further including other constituents, and does not exclude other constituents unless particularly stated on the contrary.

One embodiment of the present specification provides an organic light emitting device including a first electrode including two or more conductive units and two or more conductive connections connected to each of the conductive units; a second electrode provided opposite to the first electrode; one or more organic material layers provided between the first electrode and the second electrode; and a current carrying unit of the first electrode electrically or an auxiliary electrode electrically connecting the conductive connections, wherein one end portion of the conductive connection is electrically connected to the conductive unit, and the other end portion of the conductive connection is electrically connected to the current carrying unit of the first electrode or the auxiliary electrode, and the conductive connection includes a region in which a length of a current flowing direction is longer than a width of a direction vertical thereto.

According to one embodiment of the present specification, the conductive units may be electrically parallel connected to each other.

The current carrying unit of the first electrode of the present specification physically connects each of the conductive connections, and may perform a role of enabling a current flowing to each conductive unit through each of the conductive connections.

According to one embodiment of the present specification, the current carrying unit of the first electrode and/or the auxiliary electrode may be provided separately from the conductive unit.

According to one embodiment of the present specification, the organic light emitting device may include both the current carrying unit of the first electrode and the auxiliary electrode. Specifically, according to one embodiment of the present specification, the auxiliary electrode may be electrically connected to the conductive connection through the current carrying unit of the first electrode. Specifically, the auxiliary electrode may be provided on the current carrying unit of the first electrode.

The "on the current carrying unit" may mean not only an upper surface of the current carrying unit, but also one side surface of the current carrying unit. In addition, the on the current carrying unit may also mean an upper surface, a lower surface or one region of a side surface of the current carrying unit. Furthermore, the on the current carrying unit may include one region of an upper surface and one region of a side surface of the current carrying unit, and may also include one region of a lower surface and one region of a side surface of the current carrying unit.

Specifically, the conductive unit of the present specification is electrically parallel connected while having a form physically connected by the current carrying unit of the first electrode through a patterning process of the first electrode. One example thereof is illustrated in FIG. 1 and FIG. 2.

FIG. 1 and FIG. 2 illustrate one example of a first electrode and a current carrying unit of the first electrode in the organic light emitting device according to one embodiment of the present specification. Specifically, FIG. 1 and FIG. 2 illustrate one example of a patterned first electrode including a conductive unit (101) and conductive connections (201, 202), and the patterned first electrode being physically connected to current carrying units (301, 302, 303) of the first electrode.

Alternatively, the conductive units of the present specification have a form separated from each other through a patterning process of the first electrode, and each conductive unit may be electrically parallel connected through a conductive connection and an auxiliary electrode. One example thereof is illustrated in FIG. 3.

FIG. 3 illustrates one example of a first electrode and an auxiliary electrode in the organic light emitting device according to one embodiment of the present specification. Specifically, FIG. 3 illustrates one example of a patterned first electrode not including the current carrying unit of the first electrode, and being electrically connected through an auxiliary electrode (401). In other words, FIG. 3 illustrates one example of each conductive unit (101) capable of being electrically connected by an auxiliary electrode located in a region located by the current carrying unit of the first electrode in FIG. 1 and FIG. 2.

FIG. 4 and FIG. 5 illustrate a section of the organic light emitting device according to one embodiment of the present specification.

Specifically, FIG. 4 illustrates one example of a section of the organic light emitting device according to one embodiment of the present specification including the A-A' section of FIG. 3. In addition, FIG. 5 illustrates one example of a section of the organic light emitting device according to one embodiment of the present specification including the B-B' section of FIG. 3.

The conductive unit of the present specification may be included in a light emitting region of the organic light emitting device. Specifically, according to one embodiment of the present specification, at least one region of each of the conductive units may be located in the light emitting region of the organic light emitting device. In other words, according to one embodiment of the present specification, a light emission phenomenon occurs in an organic material layer including a light emitting layer formed on a region forming the conductive unit, and light may emit through the conductive unit.

When a narrow conductive connection is formed, disconnection possibly occurs during a process. When a conductive connection is disconnected, a conductive unit experiencing no short circuit is not electrified, and a conductive unit connected to the disconnected conductive connection may not operate.

Accordingly, in the organic light emitting device according to one embodiment of the present specification, each of the conductive units has two or more conductive connections, and therefore, there is an advantage in that, even when some of the conductive connections connected to each conductive unit are disconnected, the conductive unit may normally operate by the remaining conductive connections.

According to one embodiment of the present specification, each of the conductive units may be electrically connected to an auxiliary electrode and/or a current carrying unit of a first electrode by a conductive connection having the lowest resistance value among the two or more conductive connections that are not disconnected.

The organic light emitting device of the present specification may have a current flow in a directional order of the current carrying unit of the first electrode, the conductive connection, the conductive unit, the organic material layer and the second electrode, or in a directional order reverse thereto. Alternatively, the organic light emitting device of the present specification may have a current flow in a directional order of the auxiliary electrode, the conductive connection, the conductive unit, the organic material layer and the second electrode, or in a reverse directional order thereto.

According to one embodiment of the present specification, a current may be supplied to each of the conductive units from the auxiliary electrode or the current carrying unit of the first electrode through the conductive connection.

The light emitting region in the present specification means a region in which light emitting at a light emitting layer of an organic material layer emits through a first electrode and/or a second electrode. For example, in the organic light emitting device according to one embodiment of the present specification, the light emitting region may be formed in at least some of the first electrode region in which a conductive connection, an auxiliary electrode and/or a short circuit preventing layer are not formed among the regions in which the first electrode is formed on a substrate. In addition, a non-light emitting region in the present specification may mean the remaining regions excluding the light emitting region.

According to one embodiment of the present specification, the current carrying unit of the first electrode, the auxiliary electrode and the conductive connection may be located in a non-light emitting region of the organic light emitting device.

Each of the conductive units of the present specification is separated from each other, and a current may be supplied to each of the conductive units from the current carrying unit of the first electrode or the auxiliary electrode connected to the conductive connection. This is for preventing the whole organic light emitting device not operating, when a short circuit occurs in any one conductive unit, by a current having to flow to another unit not experiencing a short circuit flows to the conductive unit experiencing a short circuit.

The conductive connection of the present specification may be an end portion of the conductive unit in the first electrode, and the shape or the location is not particularly limited. For example, when the conductive unit is formed in a U shape or L shape, the conductive connection may be an end portion thereof. Alternatively, the conductive connection may have a form projected in the middle of one vertex, one edge or one side of a conductive unit having a polygonal shape including a quadrangle.

According to one embodiment of the present specification, the conductive connection may further include a region in which a length of a current flowing direction is longer than a width of a direction vertical thereto. Specifically, according to one embodiment of the present specification, the conductive connection may include a region in which a ratio of the length and the width is 10:1 or greater.

The conductive connection of the present specification may have relatively higher resistance compared to the conductive unit. Moreover, the conductive connection of the present specification may perform a short circuit preventing function in the organic light emitting device. In other words, when short defects occur in an organic light emitting device, the conductive connection of the present specification performs a role of enabling the operation of the device despite the short defects.

According to one embodiment of the present specification, a material of the conductive connection may be the same as a material of the conductive unit. Specifically, the conductive connection and the conductive unit are included in the first electrode, and may be formed with the same material.

Short defects may occur when a second electrode is directly in contact with a first electrode. Alternatively, short defects may also occur when an organic material layer loses the function due to a thickness decrease, deformation or the like of the organic material layer located between a first electrode and a second electrode, and the first electrode is in contact with the second electrode. When short defects occur, a low path is provided to the current of an organic light emitting device, and the organic light emitting device may not normally operate. Due to a leakage current in which a current directly flows from a first electrode to a second electrode due to short defects, the current of an organic light emitting device may flow avoiding a defectless area. This may decrease light emission output of the organic light emitting device, and in many cases, the organic light emitting device may not operate. In addition, when a current used to dispersively flow to a large area of organic materials flows intensively to a short circuit occurring location, high heat is generated locally causing a risk of device breakage or fire.

However, all operating currents flowing to a short defect region may be prevented by the conductive connection even when short defects occur in any one or more of the conductive units of the organic light emitting device of the present specification. In other words, the conductive connection may perform a role of controlling the quantity of a leakage current so that it does not increase infinitely. Accordingly, in the organic light emitting device of the present specification, the remaining conductive units having no short defects may normally operate even when short defects occur in some of the conductive units.

The conductive connection of the present specification has a high resistance value, and performs a role of preventing a current escaping through a short defect region by applying moderate resistance when short defects occur. For this, the conductive connection may have a resistance value suitable to reduce a leakage current due to short defects, and light emission efficiency loss relating thereto.

According to one embodiment of the present specification, the conductive connection may have a resistance value capable of preventing short defects by including a region in which a ratio of the length and the width is 10:1 or greater. Moreover, according to one embodiment of the present specification, the region in which a ratio of a length and a width is 10:1 or greater may be the whole region of the conductive connection. Alternatively, the region in which a ratio of the length and the width is 10:1 or greater may be some regions of the conductive connection.

The length and the width of the present specification is a relative concept, and the length may mean a spatial distance from one end to the other end of the conductive connection when seen from the top. In other words, even when the conductive connection is a combination of straight lines or includes curves, the length may mean a value measuring the length assuming a straight line. The width in the present specification may mean a distance from the center of the length direction to both ends of the vertical direction of the conductive connection when seen from the top. One example of the length and the width is illustrated in FIG. 6.

The length of the present specification may mean a measurement of a current flowing direction. In addition, the width of the present specification may mean a measurement of a direction vertical to the current flowing direction.

Furthermore, the length of the present specification may mean a distance that a current migrates from the current carrying unit of the first electrode or the auxiliary electrode to the conductive unit, and the width may mean a distance vertical to the length direction.

In FIG. 6, the distance may be a sum of a and b, and the width may be c.

According to one embodiment of the present specification, in current density of any one value from 1 mA/cm² to 5 mA/cm², the conductive connection may have a resistance value of both an operating voltage increase rate of the following Equation 1 and a leakage current value with respect to an operating current of the following Equation 2 satisfying 0.03 or less.

$$\frac{V_t - V_o}{V_o} \quad \text{[Equation 1]}$$

$$\frac{I_s}{I_t} \quad \text{[Equation 2]}$$

(The $V_t$ (V) is an operating voltage of an organic light emitting device using a conductive connection and without short defects, the $V_o$ (V) is an operating voltage of an organic light emitting device not using a conductive connection and without short defects, the $I_t$ (mA) is an operating current of an organic light emitting device using a conductive connection and without short defects, and the $I_s$ (mA) is a leakage current in an organic light emitting device using a conductive connection and having short defects in any one conductive unit.)

The $V_o$ (V) may mean an operating voltage of a case in which the remaining constitutions are the same as a case having no short defects in the same organic light emitting device except the conductive connection of the present specification.

Resistance or a resistance value of the conductive connection of the present specification may mean resistance from one end portion to the other end portion of the conductive connection. Specifically, resistance or a resistance value of the conductive connection may be resistance from the conductive unit to the auxiliary electrode. Alternatively, resistance or a resistance value of the conductive connection may be resistance from the conductive unit to the current carrying unit of the first electrode. Alternatively, resistance or a resistance value of the conductive connection may be resistance from the conductive unit to the short circuit preventing layer.

A process for drawing a resistance value of the conductive connection in which both an operating voltage increase rate of Equation 1 and a leakage current value with respect to an operating current of Equation 2 satisfy 0.03 or less is as follows.

An operating current ($I_t$) (mA) of the organic light emitting device in a state without short defects may be represented by the following equation.

$$I_t = n_{cell} \times I_{cell}$$

The $n_{cell}$ means the number of conductive units corresponding to a light emitting region in the organic light emitting device.

The $I_{cell}$ means a current (mA) operating in one conductive unit when the organic light emitting device normally operates.

Each conductive unit is parallel connected, and therefore, resistance ($R_{org}$) (Ω) applying to the whole organic light emitting device may be represented as follows.

$$R_{org} = \frac{R_{cell-org}}{n_{cell}}$$

The $R_{cell-org}$ (Ω) means organic material resistance (Ω) in one conductive unit.

In the organic light emitting device including the conductive connection, an operating voltage increases compared to a case having no conductive connections. Accordingly, even when the conductive connection is used, adjustments need to be made so that an efficiency decrease of the organic light emitting device by the conductive connection is not large.

An operating voltage increase rate obtained by adding a conductive connection in a normal operation state of the organic light emitting device may be represented by the following Equation 1.

$$\frac{V_t - V_o}{V_o} \quad \text{[Equation 1]}$$

In Equation 1, the $V_t$ (V) is an operating voltage of the organic light emitting device using a conductive connection and without short defects, and the $V_o$ (V) is an operating voltage of an organic light emitting device not using a conductive connection and without short defects.

The operating voltage increase rate (($V_t-V_o$)/$V_o$) may be calculated by the following equation.

$$\frac{V_t - V_o}{V_o} = \frac{R_{cell-spl}}{R_{cell-org}}$$

The $R_{cell-spl}$ means resistance (Ω) of a conductive connection in one conductive unit.

The $R_{cell-org}$ means resistance (Ω) of an organic material in one conductive unit.

The operating voltage increase rate (($V_t-V_o$)/$V_o$) may be derived through the following equation.

$$V_o = \frac{I_t \times (R_{org})}{1000}$$

-continued $$V_t = I_{cell} \times \frac{(R_{cell-org} + R_{cell-spl})}{1000}$$

In the case of an organic light emitting device without a conductive connection, when a current (mA) flowing through a normal organic material layer during the occurrence of a short circuit is defined as $I_n$, a leakage current (mA) flowing to a short circuit occurring location is defined as $I_s$, and resistance (Ω) of the organic material of the short circuit occurring location is defined as $R_{org-s}$, $I_n$ and $I_s$ may be represented as follows.

$$I_n = \frac{V_0}{R_{org}}$$
$$= I_t \times \frac{R_{org} \times R_{org-s}}{R_{org} + R_{org-s}} \times \frac{1}{R_{org}}$$
$$= 0$$

$$I_s = \frac{V_0}{R_{org-s}}$$
$$= I_t \times \frac{R_{org} \times R_{org-s}}{R_{org} + R_{org-s}} \times \frac{1}{R_{org-s}}$$
$$= I_t \times \frac{R_{org}}{R_{org} + R_{org-s}}$$
$$= I_t$$

In other words, when a short circuit occurs in some regions in an organic light emitting device without a conductive connection, all the set currents escape to a short circuit region ($I_s$) as the $R_{org-s}$ value decreases to close to 0. Accordingly, in the case of an organic light emitting device without a conductive connection, a current does not flow to a normal organic material layer when a short circuit occurs, and therefore, light does not emit in the organic light emitting device.

In the case of an organic light emitting device provided with the conductive connection, when $I_{n-cell}$ is defined as a current (mA) flowing through a normal light emitting region during the occurrence of a short circuit, the voltage of each parallel-connected conductive unit is the same, and the sum of the currents in all the parallel-connected conductive units is the same as an operating current ($I_t$) of a device. This may be identified from the following equation.

$(R_{cell-org}+R_{cell-spl}) \times I_{n-cell}=(R_{cell-s}+R_{cell-spl}) \times I_s$ $I_t=I_{n-cell} \times (n_{cell}-1)+I_s$ In addition, in the case of an organic light emitting device provided with the conductive connection, a leakage current flowing to a short circuit occurring location may be obtained as follows.

$$I_s = I_t \times \frac{(R_{cell-org} + R_{cell-spl})}{(R_{cell-org} + R_{cell-spl}) + (n_{cell} - 1) \times (R_{cell-s} + R_{cell-spl})}$$

Accordingly, in an organic light emitting device provided with the conductive connection of the present specification, the amount of the leakage current may significantly decrease when the denominator value sufficiently increases, as shown in the above-mentioned equation, even when an organic material layer of any one conductive unit experiences a short circuit ($R_{cell-s}=0$).

A value of a leakage current ($I_s$) with respect to an operating current ($I_t$) of an organic light emitting device provided with the conductive connection may be represented by the following Equation 2.

$$\frac{I_s}{I_t} \quad \text{[Equation 2]}$$

In Equation 2, the $I_t$ (mA) is an operating current of an organic light emitting device using a conductive connection and without short defects, and the $I_s$(mA) is a leakage current in an organic light emitting device using a conductive connection and having short defects in any one conductive unit.

Moreover, a proper value range of a leakage current ($I_s$) with respect to an operating current ($I_t$) of an organic light emitting device provided with the conductive connection may be obtained through the following equation.

$$\frac{I_s}{I_t} = \frac{(R_{cell-org} + R_{cell-spl})}{(R_{cell-org} + R_{cell-spl}) + (n_{cell} - 1) \times (R_{cell-s} + R_{cell-spl})}$$

According to one embodiment of the present specification, the conductive connection may have a resistance value of both an operating voltage increase rate (($V_t-V_o)/V_o$) and a leakage current value with respect to an operating current ($I_s/I_t$) of the organic light emitting device satisfying 0.03 or less. More specifically, the short circuit preventing layer may have a resistance value of both an operating voltage increase rate (($V_t-V_o)/V_o$) and a leakage current value with respect to an operating current ($I_s/I_t$) satisfying 0.01 or less.

Specifically, according to one embodiment of the present specification, current density during the operation of an organic light emitting device Equation 1 and Equation 2 may be any one value from 1 mA/cm² to 5 mA/cm².

According to one embodiment of the present specification, resistance of the conductive connection may satisfy the following Equation 3.

(Length of Conductive Connection÷Width of Conductive Connection)×Sheet Resistance of Conductive Connection≥400Ω  [Equation 3]

The length of the conductive connection is a length of a current flowing direction in the conductive connection, and may be a length from one end portion to the other end portion of the conductive connection. In addition, the width of the conductive connection may mean a width of a direction vertical to the length of the conductive connection, and may mean an average value of widths when the width of the conductive connection is not constant.

In other words, according to one embodiment of the present specification, resistance of the conductive connection may be 400Ω or greater. Specifically, resistance of the conductive connection may be greater than or equal to 400Ω and less than or equal to 300,000Ω. In addition, according to one embodiment of the present specification, resistance of the conductive connection may be greater than or equal to 1,000Ω and less than or equal to 300,000Ω.

When resistance of the conductive connection of the present specification is within the above-mentioned range, the conductive connection may perform a function of properly preventing a short circuit when short defects occur. In other words, when resistance of the conductive connection is 400Ω or greater, a leakage current flowing to regions having short defects may be effectively prevented.

According to one embodiment of the present specification, resistance from one of the conductive units to the current carrying unit of the first electrode or the auxiliary electrode may be greater than or equal to 400Ω and less than or equal to 300,000Ω.

According to one embodiment of the present specification, each of the conductive units may be electrically parallel connected. The conductive units of the present specification may be disposed to be separated from each other. The constitution of the conductive units of the present specification being separated from each other may be identified by the resistance between the conductive units.

Specifically, according to one embodiment of the present specification, resistance from the one conductive unit to neighboring another conductive unit may be twice or greater compared to resistance of the conductive connection. For example, when a current carrying path between any one conductive unit and neighboring another conductive unit is made only through a conductive connection and an auxiliary electrode, the conductive unit and the adjacent conductive unit go through the auxiliary electrode and the conductive connection twice. Accordingly, resistance between the conductive units may have a resistance value at least twice the conductive connection even when ignoring a resistance value of the auxiliary electrode.

According to one embodiment of the present specification, resistance between one of the conductive units and another conductive unit may be greater than or equal to 800Ω and less than or equal to 600,000Ω. Specifically, the resistance value may mean resistance from one conductive unit to adjacent another conductive unit through the short circuit preventing unit. In other words, resistance between the conductive units different from each other being greater than or equal to 800Ω and less than or equal to 600,000Ω means each conductive unit being in contact with the short circuit preventing unit electrically, and a current is supplied thereby.

In other words, according to one embodiment of the present specification, resistance from each of the conductive units to the current carrying unit of the first electrode or the auxiliary electrode may be greater than or equal to 400Ω and less than or equal to 300,000Ω.

According to one embodiment of the present specification, when the conductive units are disposed not to be separated from each other, and are directly connected electrically, a resistance value of the directly connected region may be higher than a resistance value of the conductive connection. In this case, a normal short circuit preventing function may be maintained even when the conductive unit is disposed not to be completely separated from each other and a short circuit occurs.

Resistance from the one conductive unit to neighboring another conductive unit of the present specification may mean resistance of the one conductive unit, a conductive connection and/or a short circuit preventing layer adjoining thereto, an auxiliary electrode, another conductive connection and/or a short circuit preventing layer, and another conductive unit adjoining thereto.

Equation 3 of the present specification may mean a lower resistance limit of the conductive connection capable of preventing a short circuit, when a current is supplied to the conductive unit through the conductive connection.

According to one embodiment of the present specification, the first electrode may include 1,000 or more of the conductive units separated from each other. Specifically, the first electrode may include greater than or equal to 1,000 and less than or equal to 1,000,000 of the conductive units separated from each other.

In addition, according to one embodiment of the present specification, the first electrode may be formed with patterns of two or more of the conductive units. Specifically, the conductive unit may be formed with patterns in which regions excluding the conductive connection are separated from each other.

The pattern of the present specification may have the shape of a closed figure. Specifically, the pattern may be a polygon such as a triangle, a quadrangle and a hexagon, or may be an amorphous form.

When the number of the conductive units of the present specification is 1,000 or greater, an effect of the organic light emitting device minimizing a leakage current quantity during the occurrence of a short circuit while minimizing a voltage increase during normal operation may be obtained. In addition, as the number of the conductive units of the present specification increases up to 1,000,000 or less, the effect may be maintained while maintaining an aperture ratio. In other words, when the number of the conductive units is greater than 1,000,000, a decrease in the aperture ratio may occur due to the increase in the number of auxiliary electrodes.

According to one embodiment of the present specification, the area the conductive units occupy in the organic light emitting device may be greater than or equal to 50% and less than or equal to 90% based on the plane diagram of the whole organic light emitting device. Specifically, the conductive unit is included in a light emitting region, and the area the conductive units occupy may be the same as or similar to the aperture ratio of the organic light emitting device based on the light emitting surface of the whole organic light emitting device.

In the first electrode of the present specification, each of the conductive units is electrically connected by the conductive connection, and therefore, a driving voltage of a device increases. Therefore, according to one embodiment of the present specification, the first electrode may have a short circuit preventing function by the conductive connection while lowering a driving voltage of the device by including 1,000 or more of the conductive units in order to complement a driving voltage increase by the conductive connection.

According to one embodiment of the present specification, an area of each of the conductive units may be greater than or equal to 0.01 mm$^2$ and less than or equal to 25 mm$^2$.

When an area of each of the conductive units is made to be small, there is an advantage in that both an operating voltage increase rate due to the conductive connection introduced for preventing a short circuit, and a leakage current value with respect to an operating current are lowered. In addition, there is an advantage in that product quality decline may be minimized by minimizing a non-light emitting region when a conductive unit in which light does not emit due to a short circuit is generated. However, when an area of the conductive unit is made to be too small, a ratio of the light emitting region in the whole organic light emitting device region greatly decreases leading to a problem of an organic light emitting device efficiency decrease caused by an aperture ratio decrease. Accordingly, when an organic light emitting device is manufactured with the area of the conductive unit described above, the advantages described above may be maximally exhibited while minimizing the disadvantages described above.

In the organic light emitting device of the present specification, the conductive connection, the conductive unit, and an organic material layer including a light emitting layer may be electrically series connected to each other. The light emitting layer of the present specification is located between the first electrode and the second electrode, and the two or more light emitting layers may be electrically parallel connected to each other.

According to one embodiment of the present specification, the light emitting layer is located between the conductive unit and the second electrode, and each of the light emitting layers may be electrically parallel connected to each other. In other words, the light emitting layer of the present specification may be located corresponding to a region corresponding to the conductive unit.

When the light emitting layer of the present specification operates at the same current density, a resistance value increases as the area of the light emitting layer decreases. According to one embodiment of the present specification, when the area of each of the conductive units becomes smaller and the number increases, the area of each of the light emitting layers also becomes smaller. In this case, the ratio of the voltage of the conductive connection series connected to the organic material layer decreases compared to the voltage applied to the organic material layer including the light emitting layer when the organic light emitting device operates.

When a short circuit occurs in the organic light emitting device of the present specification, the leakage current quantity may be determined by a resistance value and an operating voltage from the auxiliary electrode to the conductive unit regardless of the number of the conductive units. Accordingly, a voltage increase phenomenon by the conductive connection during normal operation may be minimized when increasing the number of the conductive units, and the leakage current quantity may also be minimized when a short circuit occurs.

According to one embodiment of the present specification, the auxiliary electrode may have sheet resistance of $3\Omega/\square$ or less. Specifically, the auxiliary electrode may have sheet resistance of $1\Omega/\square$ or less.

When sheet resistance of any one of a first electrode and a second electrode having a large area is higher than is needed, voltages may be different for each location of the electrode. As a result, when a potential difference between the first electrode and the second electrode placing an organic material layer in between becomes different, brightness uniformity of an organic light emitting device may decrease. Accordingly, in order to lower the sheet resistance of the first electrode or the second electrode having higher sheet resistance than is needed, an auxiliary electrode may be used. The sheet resistance of the auxiliary electrode of the present specification may be $3\Omega/\square$ or less, and specifically $1\Omega/\square$ or less, and in the above-mentioned range, the organic light emitting device may maintain high brightness uniformity.

According to one embodiment of the present specification, the first electrode may be formed as a transparent electrode. In this case, sheet resistance of the first electrode may be higher than sheet resistance required for the operation of the organic light emitting device. Accordingly, in order to lower the sheet resistance of the first electrode, the sheet resistance of the first electrode may be lowered to the sheet resistance level of the auxiliary electrode by electrically connecting the auxiliary electrode to the first electrode.

According to one embodiment of the present specification, the auxiliary electrode may be provided in a region other than a light emitting region. Specifically, the auxiliary electrode may be provided on the current carrying unit of the first electrode. Alternatively, when the current carrying unit of the first electrode is not present, the auxiliary electrode may be provided in a region where the current carrying unit of the first electrode is located.

According to one embodiment of the present specification, the auxiliary electrode may be formed with conductive lines electrically connected to each other. Specifically, the conductive lines may be formed with conductive patterns. Specifically, the whole auxiliary electrode may be driven by applying a voltage to at least one region of the auxiliary electrode of the present specification.

According to one embodiment of the present specification, the organic light emitting device may be used as being included in OLED illumination. In the case of the OLED illumination, light emission with uniform brightness in the whole light emitting region, that is, in all the organic light emitting devices, is important. Specifically, in order to accomplish uniform brightness in the OLED illumination, voltages formed between the first electrode and the second electrode of all the organic light emitting devices included in the OLED illumination are preferably maintained to be the same.

When the first electrode of the present specification is a transparent electrode, and the second electrode is a metal electrode, the second electrode of each organic light emitting device has sufficiently low sheet resistance, and there is almost no voltage difference in the second electrode of each of the organic light emitting devices, however, in the case of the first electrode, a voltage difference may exist in each of the organic light emitting devices. According to one embodiment of the present specification, the auxiliary electrode, and specifically, a metal auxiliary electrode, may be used in order to complement the first electrode voltage difference of each of the organic light emitting devices.

According to one embodiment of the present specification, the metal auxiliary electrode may be formed with conductive lines electrically connected to each other. Specifically, the auxiliary electrode is capable of allowing almost no voltage difference in the first electrode of each organic light emitting device by forming conductive lines.

According to one embodiment of the present specification, the conductive unit may have sheet resistance of $1\Omega/\square$ or greater, or $3\Omega/\square$ or greater, and specifically, may be $10\Omega/\square$ or greater. In addition, the conductive unit may have sheet resistance of $10,000\Omega/\square$ or less, or $1,000\Omega/\square$ or less. In other words, the conductive unit of the present specification may have sheet resistance of greater than or equal to $1\Omega/\square$ and less than or equal to $10,000\Omega/\square$, or greater than or equal to $10\Omega/\square$ and less than or equal to $1,000$ $\Omega/\square$.

According to one embodiment of the present specification, the sheet resistance level required for the conductive unit may be controlled so as to be inversely proportional to an area of the conductive unit corresponding to a light emitting area. For example, when the conductive unit has a light emitting area of $100$ $cm^2$, the sheet resistance required for the conductive unit may be approximately $1\Omega/\square$. Moreover, when each of the conductive units is formed to be small, the sheet resistance required for the conductive unit may be $1\Omega/\square$ or greater.

According to one embodiment of the present specification, when the first electrode is formed as a transparent electrode such as ITO, an auxiliary electrode may be used so that the sheet resistance of the conductive unit satisfies $1\Omega/\square$ or greater. Specifically, the auxiliary electrode may be a metal auxiliary electrode.

The sheet resistance of the conductive unit of the present specification may be determined by materials forming the conductive unit, and may also be lowered to a sheet resistance level of an auxiliary electrode by being electrically connected to the auxiliary electrode. Accordingly, the sheet resistance value of the conductive unit required in the organic light emitting device of the present specification may be adjusted by the materials of the auxiliary electrode and the conductive unit.

According to one embodiment of the present specification, the auxiliary electrode may be disposed separately from the conductive unit, and may be provided as a mesh structure surrounding one or more of the conductive units.

Specifically, according to one embodiment of the present specification, the auxiliary electrode may have a structure including two or more branch points. The branch point of the present specification may include three or more branches. The auxiliary electrode is not provided with conductive lines that are not electrically connected to each other, and may be provided in a form in which two or more conductive lines partly adjoins. In other words, the auxiliary electrode of the present specification is not provided in a stripe shape, and may be provided in a form including an area in which at least two conductive lines cross to each other.

The branch point of the present specification may mean a region forming three or more branches by the auxiliary electrodes adjoining to each other, and a current of the auxiliary electrode may flow dispersively to the branches through the branch point.

When short defects occur in some local regions of an organic light emitting device having a short circuit preventing function, light emission intensity of areas surrounding the short defect occurring location may decrease when the auxiliary electrode is provided in a stripe shape. As a result, a massive voltage drop (IR drop) occurs in the auxiliary electrode of the short defect occurring region, as a current 100 times more than a current during a normal operation flows to the short circuit occurring region. In other words, the whole organic light emitting device not operating may be prevented by the short circuit preventing function, however, a phenomenon in which surroundings of the short defect occurring region become dark occurs leading to a problem of significant merchantability decline.

Accordingly, in the organic light emitting device of the present specification, the auxiliary electrode includes two or more branch points having three or more branches so that a current is dispersed to a large region when a short circuit occurs. In other words, by the auxiliary electrode of the present specification, a voltage drop (IR drop) occurring in the auxiliary electrode of a short circuit occurring region is minimized, and light emission intensity of the whole organic light emitting device is capable of being uniform even when a short circuit occurs.

According to one embodiment of the present specification, the auxiliary electrode may have resistance between the adjacent branch points of $35\Omega$ or less. Specifically, the auxiliary electrode may have resistance between the adjacent branch points of $18\Omega$ or less. In addition, resistance between the adjacent branch points of the present specification may be $0\Omega$ or greater.

Alternatively, according to one embodiment of the present specification, the auxiliary electrode may have a distance between the adjacent branch points of 21 mm or less. Specifically, a distance between the branch points may be greater than or equal to 0.2 mm and less than or equal to 21 mm.

According to one embodiment of the present specification, the auxiliary electrode may have a distance between the adjacent branch points of 10 mm or greater, or greater than or equal to 0.2 mm and less than or equal to 10 mm.

Moreover, according to one embodiment of the present specification, the auxiliary electrode may have a distance between the adjacent branch points of 10 mm, and resistance between the branch points of $18\Omega$ or less.

According to one embodiment of the present specification, a short circuit preventing layer provided between the first electrode and the auxiliary electrode may be further included. The short circuit preventing layer of the present specification may assist a short circuit preventing function of the conductive connection.

According to one embodiment of the present specification, the short circuit preventing layer may be provided adjoining at least one surface of the auxiliary electrode. Specifically, according to one embodiment of the present specification, the short circuit preventing layer may be provided on an upper surface, lower surface, or side surface on which the auxiliary electrode is formed.

According to one embodiment of the present specification, the auxiliary electrode may be electrically connected to the conductive connection through the short circuit preventing layer.

The short circuit preventing layer of the present specification may be provided on the current carrying unit of the first electrode. Alternatively, when the current carrying unit of the first electrode is not present, the short circuit preventing layer may be provided adjoining one end portion of the conductive connection.

According to one embodiment of the present specification, when the organic light emitting device includes the short circuit preventing layer, the conductive connection in Equations 1 and 2 may be interpreted to include the conductive connection and the short circuit preventing layer.

According to one embodiment of the present specification, resistance from the auxiliary electrode of the short circuit preventing layer to the first electrode may be greater than or equal to $400\Omega$ and less than or equal to $300,000\Omega$.

In addition, according to one embodiment of the present specification, resistance between the auxiliary electrode and the conductive unit electrically connected via the short circuit preventing layer may be greater than or equal to $400\Omega$ and less than or equal to $300,000\Omega$ due to the resistance increase caused by the short circuit preventing layer. Specifically, resistance between the auxiliary electrode and the conductive unit electrically connected via the short circuit preventing layer may be from $400\Omega$ to $300,000\Omega$, or from $1,000\Omega$ to $300,000\Omega$.

According to one embodiment of the present specification, the short circuit preventing layer may have a thickness of greater than or equal to 1 nm and less than or equal to 10 μm.

The short circuit preventing layer may maintain a normal operating voltage in the thickness range and/or the thickness direction resistance range described above when no short circuit occurs in the organic light emitting device. In addition, the organic light emitting device may operate in a normal range within the thickness range and/or the thickness direction resistance range described above even when a short circuit occurs in the organic light emitting device.

Specifically, according to one embodiment of the present specification, resistance of the short circuit preventing layer may mean resistance from the auxiliary electrode to the conductive connection. Alternatively, according to one embodiment of the present specification, resistance of the short circuit preventing layer may mean resistance from the auxiliary electrode to the current carrying unit of the first electrode. In other words, resistance of the short circuit preventing layer may be resistance according to an electrical distance for electrically connecting from the auxiliary electrode to the conductive connection.

According to one embodiment of the present specification, volume resistivity of the short circuit preventing layer may be greater than or equal to 0.63 Ωcm and less than or equal to $8.1 \times 10^{10}$ Ωcm.

According to one embodiment of the present specification, volume resistivity ($\rho_{spl}$) (Ωcm) of the short circuit preventing layer may be calculated from the following equation.

$$\rho_{spl} = \frac{R_{cell-spl} \times A_{spl}}{t_{spl}}$$

The $A_{spl}$ (cm$^2$) means an area in which electricity is capable of flowing from the auxiliary electrode to one conductive connection through the short circuit preventing layer in a thickness direction.

The $R_{cell-spl}$ means resistance (Ω) of the short circuit preventing layer with respect to one conductive unit.

The $t_{spl}$ (μm) may mean a thickness of the short circuit preventing layer, or the shortest distance of electricity moving from the auxiliary electrode to the conductive connection.

The thickness direction is according to one example of electricity moving in the short circuit preventing layer, and may mean a direction of electricity moving from one region to another region of the short circuit preventing layer.

As can be seen from the above-mentioned equation, volume resistivity ($\rho_{spl}$) of the short circuit preventing layer with respect to one conductive unit may be determined from resistance ($R_{cell-spl}$) of the short circuit preventing layer with respect to one conductive unit, and an area ($A_{spl}$) in which electricity is capable of flowing from the auxiliary electrode to one conductive connection through the short circuit preventing layer in a thickness direction, and a thickness ($t_{spl}$) of the short circuit preventing layer.

According to one embodiment of the present specification, volume resistivity of the short circuit preventing layer may be greater than or equal to 0.63 Ωcm and less than or equal to $8.1 \times 10^{10}$ Ωcm. Within the above-mentioned range, the short circuit preventing layer may maintain a normal operating voltage when no short circuit occurs in the organic light emitting device. In addition, the short circuit preventing layer may perform a short circuit preventing function, and the organic light emitting device may operate in a normal range even when a short circuit occurs. The volume resistivity may be calculated as follows.

According to one embodiment of the present specification, the short circuit preventing layer has a resistance range of greater than or equal to 70Ω and less than or equal to 300,000Ω, and the short circuit preventing layer has a thickness of greater than or equal to 1 nm and less than or equal to 10 μm, and when an area of one conductive unit is from 300×300 μm$^2$ to 3×3 mm$^2$, an area ($A_{spl}$) in which electricity is capable of flowing from the auxiliary electrode formed on the one conductive connection to one conductive unit through the short circuit preventing layer in a thickness direction may be determined at a 1% to 30% level of one conductive unit. Accordingly, an area ($A_{spl}$) in which electricity is capable of flowing from the auxiliary electrode to the first electrode of one cell through the short circuit preventing layer in a thickness direction with respect to the one conductive unit may be from $9 \times 10^{-6}$ cm$^2$ (300 μm×300 μm×0.01) to $2.7 \times 10^{-2}$ cm$^2$ (0.3 cm×0.3 cm×0.3). In this case, volume resistivity of the short circuit preventing layer may be calculated as in the following equation.

$$\frac{70\Omega \times 9 \times 10^{-6} cm^2}{10 \ \mu m} \leq \rho_{spl} \leq \frac{300,000\Omega \times 2.7 \times 10^{-2} cm^2}{0.001 \ \mu m}$$

According to one embodiment of the present specification, the short circuit preventing layer may include one, two or more types selected from the group consisting of carbon powder; carbon films; conductive polymers; organic polymers; metals; metal oxides; inorganic oxides; metal sulfides; and insulating materials. Specifically, a mixture of two or more selected from the group consisting of zirconium oxide ($ZrO_2$), nichrome, indium tin oxide (ITO), zinc sulfide (ZnS) and silicon dioxide ($SiO_2$) may be used.

According to one embodiment of the present specification, the organic light emitting device may further include a substrate, and the first electrode may be provided on the substrate.

According to one embodiment of the present specification, the first electrode may be a transparent electrode.

When the first electrode is a transparent electrode, the first electrode may be a conductive oxide such as indium tin oxide (ITO) or indium zinc oxide (IZO). Moreover, the first electrode may be a semi-transparent electrode. When the first electrode is a semi-transparent electrode, the first electrode may be prepared with a semi-transparent metal such as Ag, Au, Mg, Ca or alloys thereof. When a semi-transparent metal is used as the first electrode, the organic light emitting device may have a microcavity structure.

According to one embodiment of the present specification, the auxiliary electrode may be formed with metal materials. In other words, the auxiliary electrode may be a metal electrode.

The auxiliary electrode may generally use all metals. Specifically, aluminum, copper and/or silver having favorable conductivity may be included. When the auxiliary electrode uses aluminum for adhesion with a transparent electrode or stability in a photo process, a molybdenum/aluminum/molybdenum layer may also be used.

According to one embodiment of the present specification, the organic material layer may further include a light emitting layer, and one, two or more types selected from the group consisting of a hole injection layer; a hole transfer layer; a hole blocking layer; a charge generating layer; an electron blocking layer; an electron transfer layer; and an electron injection layer.

The charge generating layer means a layer generating holes and electrons when a voltage is applied.

As the substrate, a substrate having excellent transparency, surface smoothness, handling easiness and water resistance may be used. Specifically, a glass substrate, a thin glass substrate or a transparent plastic substrate may be used. The plastic substrate may include a film such as polyethylene terephthalate (PET), polyethylene naphthalate (PEN), polyether ether ketone (PEEK) and polyimide (PI) in the form of a single layer or multilayer. In addition, the substrate may include a light scattering function in the substrate itself. However, the substrate is not limited thereto, and substrates commonly used in organic light emitting devices may be used.

According to one embodiment of the present specification, the first electrode may be an anode, and the second electrode may be a cathode. In addition, the first electrode may be a cathode, and the second electrode may be an anode.

As the anode, a material having large work function is normally preferable so that hole injection to the organic material layer is smooth. Specific examples of the anode material capable of being used in the present invention include metals such as vanadium, chromium, copper, zinc and gold, or alloys thereof; metal oxides such as zinc oxides, indium oxides, indium tin oxides (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

The materials of the anode are not limited to the anode, and may be used as a material of the cathode.

As the cathode, a material having small work function is normally preferable so that electron injection to the organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The materials of the cathode are not limited to the cathode, and may be used as a material of the anode.

As the hole transfer layer material according to the present specification, a material capable of receiving the holes from the anode or the hole injection layer, moving the holes to the light emitting layer, and having high mobility for the holes, is suitable. Specific examples thereof include an arylamine-based organic material, a conductive polymer, a block copolymer having conjugated parts and non-conjugated parts together, and the like, but are not limited thereto.

As the light emitting layer material according to the present specification, a material capable of emitting light in a visible region by receiving holes and electrons from the hole transfer layer and the electron transfer layer, respectively, and binding the holes and the electrons, and is preferably a material having favorable quantum efficiency for fluorescence or phosphorescence. Specific examples thereof include a 8-hydroxy-quinoline aluminum complex ($Alq_3$); a carbazole-based compound; a dimerized styryl compound; BAlq; a 10-hydroxybenzo quinolin-metal compound; a benzoxazole-, a benzthiazole- and a benzimidazole-based compound; a poly(p-phenylenevinylene) (PPV)-based polymer; a spiro compound; polyfluorene, rubrene, and the like, but are not limited thereto.

As the electron transfer layer material according to the present specification, a material capable of favorably receiving electrons from the cathode, moving the electrons to the light emitting layer, and having high mobility for the electrons, is suitable. Specific examples thereof include an Al complex of 8-hydroxyquinoline; a complex including $Alq_3$; an organic radical compound; a hydroxyflavone-metal complex and the like, but are not limited thereto.

According to one embodiment of the present specification, the auxiliary electrode may be located in a non-light emitting region of the organic light emitting device.

According to one embodiment of the present specification, the organic light emitting device may further include an insulation layer in a non-light emitting region.

According to one embodiment of the present specification, the insulation layer may insulate the conductive connection and the auxiliary electrode from the organic material layer.

According to one embodiment of the present specification, the organic light emitting device may be sealed with an encapsulation layer.

The encapsulation layer may be formed with a transparent resin layer. The encapsulation layer performs a role of preventing the organic light emitting device from oxygen and contaminants, and may be a transparent material so as not to inhibit light emission of the organic light emitting device. The transparency may mean transmitting 60% or more of light, and specifically, transmitting 75% or more of light.

According to one embodiment of the present specification, the organic light emitting device may emit white light having a color temperature of greater than or equal to 2,000 K and less than or equal to 12,000 K.

According to one embodiment of the present specification, the organic light emitting device may include a light scattering layer.

Specifically, according to one embodiment of the present specification, a substrate provided on a surface opposite to the surface provided with the organic material layer of the first electrode may be further included, and a light scattering layer provided between the substrate and the first electrode may be further included. According to one embodiment of the present specification, the light scattering layer may include a planarization layer. According to one embodiment of the present specification, the planarization layer may be provided between the first electrode and the light scattering layer.

Alternatively, according to one embodiment of the present specification, a light scattering layer may be further included on a surface opposite to the surface provided with the first electrode of the substrate.

According to one embodiment of the present specification, the light scattering layer induces light scattering, and the structure is not particularly limited as long as it has a structure capable of enhancing light scattering efficiency of the organic light emitting device. Specifically, according to one embodiment of the present specification, the light scattering layer may have a structure in which scattered particles are dispersed into a binder, a film having unevenness, and/or a film having haziness.

According to one embodiment of the present specification, the light scattering layer may be directly formed on the substrate using a method such as spin coating, bar coating and slit coating, or may be formed using a method of being prepared in a film form and attached.

According to one embodiment of the present specification, the organic light emitting device may be a flexible organic light emitting device. In this case, the substrate may include a flexible material. Specifically, the substrate may be bendable thin-film-type glass, a plastic substrate or film-type substrate.

A material of the plastic substrate is not particularly limited, however, a film such as polyethylene terephthalate (PET), polyethylene naphthalate (PEN), polyether ether ketone (PEEK) and polyimide (PI) may be generally included in the form of a single layer or multilayer.

The present specification provides a display device including the organic light emitting device. The organic light emitting device may perform a role of a pixel or back light in the display device. As other constitutions of the display device, constitutions known in the art may be used.

The present specification provides an illumination device including the organic light emitting device. The organic light emitting device may perform a role of a light emitting unit in the illumination device. As other constitutions of the illumination device, constitutions known in the art may be used.

The invention claimed is:

1. An organic light emitting device comprising:
   a first electrode including two or more conductive units and two or more conductive connections connected to each of the two or more conductive units;
   a second electrode
   a current carrying unit of the first electrode or an auxiliary electrode electrically connecting the two or more conductive connections;
   an insulation layer covers the two or more conductive connections and the current carrying unit of the first electrode or the auxiliary electrode; and
   one or more organic material layers provided between the first electrode and the second electrode and provided on the two or more conductive units and the insulation layer,
   wherein one end portion of the conductive connection is electrically connected to the conductive unit, and the other end portion of the conductive connection is electrically connected to the current carrying unit of the first electrode or the auxiliary electrode, and
   wherein each of the two or more conductive connection includes a region in which a length of a current flowing direction is longer than a width of a direction perpendicular thereto, and
   in current density of any one value from 1 mA/cm$^2$ to 5 mA/cm$^2$, the conductive connection has a resistance value of both an operating voltage increase rate of the following Equation 1 and a leakage current value with respect to an operating current of the following Equation 2 satisfying 0.03 or less:

$$\frac{V_t - V_o}{V_o} \quad \text{[Equation 1]}$$

$$\frac{I_s}{I_t} \quad \text{[Equation 2]}$$

wherein the $V_t$ (V) is an operating voltage of an organic light emitting device using a conductive connection and without short defects,
   the $V_o$ (V) is an operating voltage of an organic light emitting device not using a conductive connection and without short defects,
   the $I_t$ (mA) is an operating current of an organic light emitting device using a conductive connection and without short defects, and
   the $I_s$ (mA) is a leakage current in an organic light emitting device using a conductive connection and having short defects in any one conductive unit.

2. The organic light emitting device of claim 1, wherein the conductive connection includes a region in which a ratio of the length and the width is 10:1 or greater.

3. The organic light emitting device of claim 1, wherein resistance of the conductive connection is greater than or equal to 400Ω and less than or equal to 300,000Ω.

4. The organic light emitting device of claim 1, wherein the first electrode includes 1,000 or more of the conductive units separated from each other.

5. The organic light emitting device of claim 1, wherein an area of each of the conductive units is greater than or equal to 0.01 mm$^2$ and less than or equal to 25 mm$^2$.

6. The organic light emitting device of claim 1, wherein resistance from the one conductive unit to neighboring another conductive unit is twice or greater compared to resistance of the conductive connection.

7. The organic light emitting device of claim 1, wherein the conductive unit has sheet resistance of 1Ω/□ or greater.

8. The organic light emitting device of claim 1, wherein the current carrying unit of the first electrode or the auxiliary electrode is provided to be separated from the conductive unit.

9. The organic light emitting device of claim 1, wherein the auxiliary electrode is separated from each of the conductive units, and is provided as a mesh structure surrounding one or more of the conductive units.

10. The organic light emitting device of claim 1, wherein the auxiliary electrode includes two or more branch points having 3 or more branches, and resistance between the adjacent branch points is 35Ω or less.

11. The organic light emitting device of claim 1, wherein the auxiliary electrode has sheet resistance of 3Ω/□ or less.

12. The organic light emitting device of claim 1, further comprising a short circuit preventing layer provided between the first electrode and the auxiliary electrode.

13. The organic light emitting device of claim 12, wherein the auxiliary electrode is electrically connected to the conductive connection through the short circuit preventing layer.

14. The organic light emitting device of claim 12, wherein the short circuit preventing layer is provided on an upper surface, a lower surface, or a side surface of the auxiliary electrode.

15. The organic light emitting device of claim 12, wherein the short circuit preventing layer includes one, two or more types selected from the group consisting of carbon powder; carbon films; conductive polymers; organic polymers; metals; metal oxides; inorganic oxides; metal sulfides; and insulating materials.

16. The organic light emitting device of claim 1, wherein an area the conductive units occupy in the organic light emitting device is greater than or equal to 50% and less than or equal to 90% based on a plane diagram of the whole organic light emitting device.

17. The organic light emitting device of claim 1, which is a flexible organic light emitting device.

18. A display device comprising an organic light emitting device including:
   a first electrode including two or more conductive units and two or more conductive connections connected to each of the two or more conductive units;
   a second electrode
   a current carrying unit of the first electrode or an auxiliary electrode electrically connecting the two or more conductive connections;
   an insulation layer covers the two or more conductive connections and the current carrying unit of the first electrode or the auxiliary electrode; and
   one or more organic material layers provided between the first electrode and the second electrode and provided on the two or more conductive units and the insulation layer,
   wherein one end portion of the conductive connection is electrically connected to the conductive unit, and the other end portion of the conductive connection is electrically connected to the current carrying unit of the first electrode or the auxiliary electrode, and wherein each of the two or more conductive connection includes a region in which a length of a current flowing direction is longer than a width of a direction perpendicular thereto, and in current density of any one value from 1 mA/cm² to 5 mA/cm², the conductive connection has a resistance value of both an operating voltage increase rate of the following Equation 1 and a leakage current value with respect to an operating current of the following Equation 2 satisfying 0.03 or less:

$$\frac{V_t - V_o}{V_o} \quad \text{[Equation 1]}$$

$$\frac{I_s}{I_t} \quad \text{[Equation 2]}$$

wherein the $V_t$ (V) is an operating voltage of an organic light emitting device using a conductive connection and without short defects, the $V_o$ (V) is an operating voltage of an organic light emitting device not using a conductive connection and without short defects, the $I_t$ (mA) is an operating current of an organic light emitting device using a conductive connection and without short defects, and the $I_s$ (mA) is a leakage current in an organic light emitting device using a conductive connection and having short defects in any one conductive unit.

19. An illumination device comprising an organic light emitting device including:
 a first electrode including two or more conductive units and two or more conductive connections connected to each of the two or more conductive units;
 a second electrode
 a current carrying unit of the first electrode or an auxiliary electrode electrically connecting the two or more conductive connections;
 an insulation layer covers the two or more conductive connections and the current carrying unit of the first electrode or the auxiliary electrode; and
 one or more organic material layers provided between the first electrode and the second electrode and provided on the two or more conductive units and the insulation layer, wherein one end portion of the conductive connection is electrically connected to the conductive unit, and the other end portion of the conductive connection is electrically connected to the current carrying unit of the first electrode or the auxiliary electrode, and wherein each of the two or more conductive connection includes a region in which a length of a current flowing direction is longer than a width of a direction perpendicular thereto, and in current density of any one value from 1 mA/cm² to 5 mA/cm², the conductive connection has a resistance value of both an operating voltage increase rate of the following Equation 1 and a leakage current value with respect to an operating current of the following Equation 2 satisfying 0.03 or less:

$$\frac{V_t - V_o}{V_o} \quad \text{[Equation 1]}$$

$$\frac{I_s}{I_t} \quad \text{[Equation 2]}$$

wherein the $V_t$ (V) is an operating voltage of an organic light emitting device using a conductive connection and without short defects, the $V_o$ (V) is an operating voltage of an organic light emitting device not using a conductive connection and without short defects, the $I_t$ (mA) is an operating current of an organic light emitting device using a conductive connection and without short defects, and the $I_s$ (mA) is a leakage current in an organic light emitting device using a conductive connection and having short defects in any one conductive unit.

* * * * *